(12) United States Patent
Hu et al.

(10) Patent No.: US 9,349,385 B2
(45) Date of Patent: May 24, 2016

(54) ELECTRONIC DEVICE AND GAIN CONTROLLING METHOD

(71) Applicant: HTC Corporation, Taoyuan County (TW)

(72) Inventors: Chun-Ren Hu, Taoyuan County (TW);
Hann-Shi Tong, Taoyuan County (TW);
Chun-Min Lee, Taoyuan County (TW);
Lei Chen, Taoyuan County (TW);
Yu-Chieh Lai, Taoyuan County (TW);
Chao-Hung Tai, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 234 days.

(21) Appl. No.: 14/190,097

(22) Filed: Feb. 26, 2014

(65) Prior Publication Data

US 2014/0233761 A1    Aug. 21, 2014

Related U.S. Application Data

(63) Continuation-in-part of application No. 13/671,499, filed on Nov. 7, 2012, now Pat. No. 9,064,497.

(60) Provisional application No. 61/885,515, filed on Oct. 2, 2013, provisional application No. 61/601,583, filed on Feb. 22, 2012.

(51) Int. Cl.
*G10L 21/034* (2013.01)
*H03G 3/32* (2006.01)
*G10L 21/0364* (2013.01)
*G10L 25/84* (2013.01)

(52) U.S. Cl.
CPC .............. *G10L 21/034* (2013.01); *H03G 3/32* (2013.01); *G10L 21/0364* (2013.01); *G10L 25/84* (2013.01)

(58) Field of Classification Search
CPC .................................................... G10L 21/034
See application file for complete search history.

(56) References Cited

U.S. PATENT DOCUMENTS

| | | | | |
|---|---|---|---|---|
| 7,873,426 B2* | 1/2011 | Yamada | ............... | H03M 1/188 700/94 |
| 7,907,741 B2* | 3/2011 | Gyotoku | .............. | H04N 5/9202 348/231.4 |
| 2007/0003078 A1* | 1/2007 | Escott | ................... | H03G 7/007 381/107 |
| 2007/0253572 A1* | 11/2007 | Li | ........................ | H04R 25/502 381/72 |
| 2009/0161888 A1* | 6/2009 | Okada | ..................... | H04R 3/00 381/107 |
| 2010/0135508 A1* | 6/2010 | Wu | ......................... | H04R 3/00 381/122 |

FOREIGN PATENT DOCUMENTS

| | | |
|---|---|---|
| CN | 101119106 | 2/2008 |
| TW | 201335931 | 9/2013 |

OTHER PUBLICATIONS

"Office Action of Taiwan Counterpart Application", issued on Sep. 21, 2015, p. 1-p. 4.

\* cited by examiner

*Primary Examiner* — Paul Huber
(74) *Attorney, Agent, or Firm* — Jianq Chyun IP Office

(57) ABSTRACT

An electronic device and a corresponding gain controlling method are provided. The gain controlling method includes the steps of receiving a sound signal, calculating a sound level according to each value of the sound signal in a past period, determining a gain value according to the sound level, using the gain value to amplify the sound signal, and then storing the sound signal.

25 Claims, 4 Drawing Sheets

ELECTRONIC DEVICE AND GAIN CONTROLLING METHOD

CROSS-REFERENCE TO RELATED APPLICATION

This application is a continuation-in-part application of and claims the priority benefit of a prior application Ser. No. 13/671,499, filed on Nov. 7, 2012, now pending. The prior application Ser. No. 13/671,499 claims the priority benefits of U.S. provisional application Ser. No. 61/601,583, filed on Feb. 22, 2012. This application also claims the priority benefits of U.S. provisional application Ser. No. 61/885,515, filed on Oct. 2, 2013. The entirety of each of the above-mentioned patent applications is hereby incorporated by reference herein and made a part of this specification.

FIELD OF THE INVENTION

The invention is directed to an electronic device and a method for processing sound signals and more particularly, to an electronic device and a gain controlling method.

DESCRIPTION OF RELATED ART

Recently, many consumer electronic devices are provided with sound playback and recording functions, and the playback function is easily affected by the environment. For example, in a quiet environment, a sound level of the playback may probably be too high, while in a noisy environment, the sound level may probably be too low.

The recording may probably encounter a scenario that the sound level is extremely low or extremely high. For example, most people speak at a low sound level, but in a concert, the sound level would be quite high. In the current consumer electronic devices, during sound recording, no matter whether the sound level of the received sound signal is high or low, the sound signal is amplified to a target level, but the common scenario is that the real sound level would be high and low and not maintained in the same level. Such sound recording function is incapable of keeping the sound signal in a dynamic range, which leads to the reduction of sound fidelity.

SUMMARY

The invention provides an electronic device and a gain controlling method to resolve an issue that a sound level of sound playback is inconsistent with ambient sound level and keep a dynamic range for recorded sound.

The invention is directed to an electronic device, including a microphone, an analog-to-digital converter and a processor. The microphone receives a sound signal. The analog-to-digital converter is coupled to the microphone and converts the sound signal from analog signal into digital signal. The processor is coupled to the analog-to-digital converter, calculates a sound level according to each value of the sound signal in a past period, determines a gain value according to the sound level, uses the gain value to amplify the sound signal and then stores the first sound signal.

The invention is directed to a gain controlling method, including the following steps. A sound signal is received. A sound level is calculated according to each value of the sound signal in a past period. A gain value is determined according to the sound level. The gain value is used to amplify the sound signal, and then the sound signal is stored.

To sum up, in the electronic device and the corresponding gain controlling method, the gain value of sound playback can be determined according to the ambient sound level, so as to resolve the issue that the sound level of sound playback is inconsistent with the ambient sound level. Moreover, in the electronic device and the corresponding gain controlling method, the gain value of the sound signal can be determined according to the sound level of the sound signal in the past period to keep the dynamic range for the sound signal.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
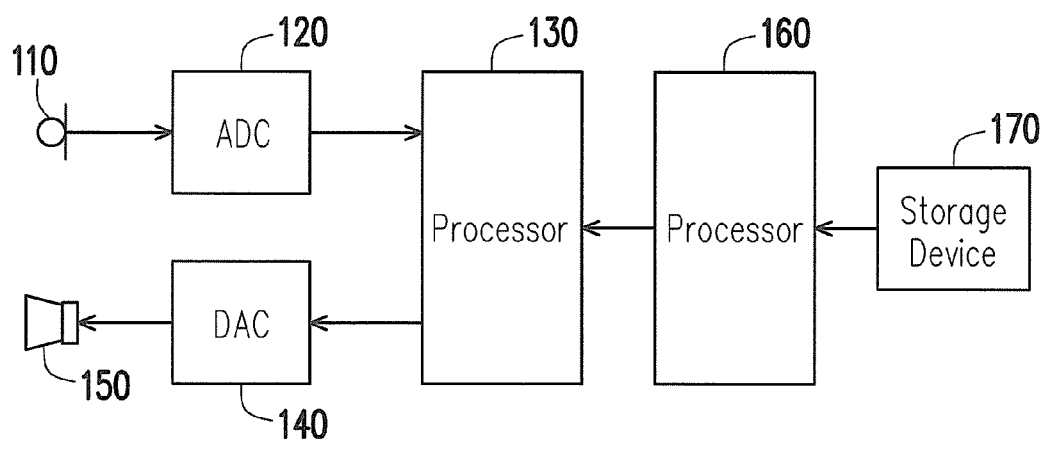
FIG. 1 is a schematic diagram illustrating a sound playback device according an embodiment of the invention.

FIG. 1 is a schematic diagram illustrating a sound playback device 100 according an embodiment of the invention. The sound playback device is 100 may be any type of electronic device having a sound playback capability. The sound playback device 100 includes a microphone 110, an analog-to-digital converter 120, a processor 130, a digital-to-analog converter 140, a speaker 150, a processor 160 and a storage device 170. The analog-to-digital converter 120 is coupled to the microphone 110, the digital-to-analog converter 140 is coupled to the speaker 150, the processor 130 is coupled to the analog-to-digital converter 120 and the digital-to-analog converter 140, and the processor 160 is coupled to the processor 130 and the storage device 170. The processor 130 may be a digital signal processor (DSP), and the processor 160 may be an application processor of the sound playback device 100. In the present embodiment, the storage device 170 is an element built in the sound playback device 100, while in another embodiment, the storage device 170 may not have to belong to the sound playback device 100, but externally connected with the sound playback device 100.

Figure 2:
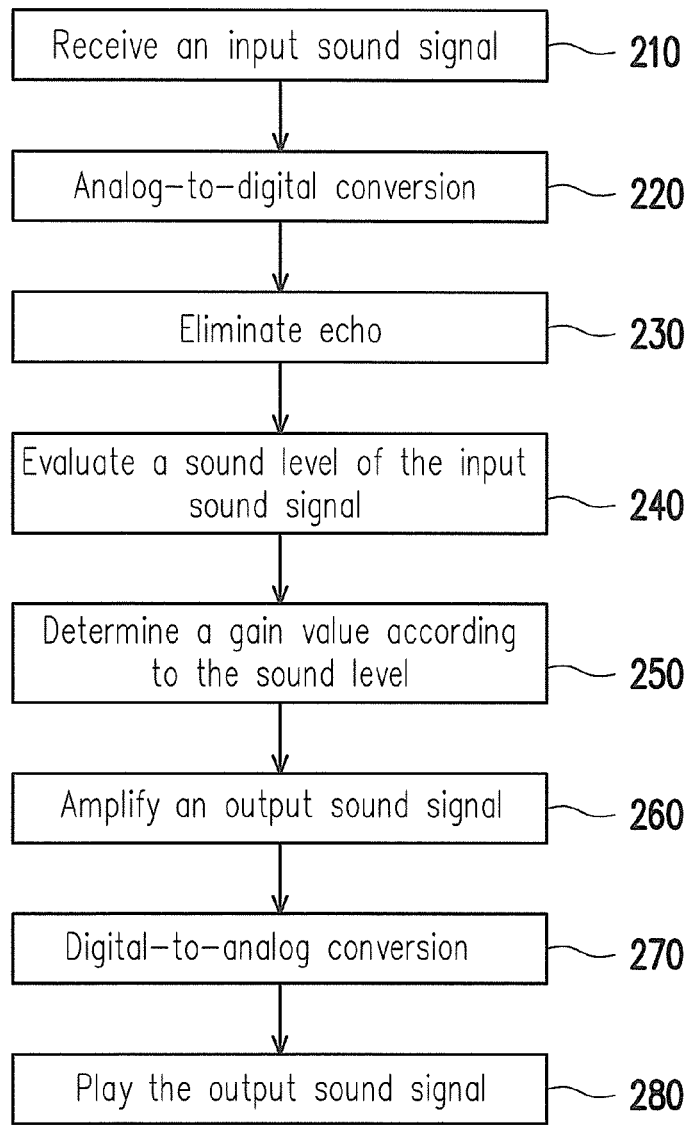
FIG. 2 is a flowchart illustrating a gain controlling method according an embodiment of the invention.

FIG. 2 is a flowchart illustrating a gain controlling method according an embodiment of the invention. The method may be performed by the sound playback device 100. In step 210, the microphone 110 receives an input sound signal. The input sound signal is ambient noise of the sound playback device 100. In step 220, the analog-to-digital converter 120 converts the input sound signal from analog signal into digital signal.

The sound playback device 100 may play an output sound signal through the speaker 150. The processor 160 may provide the output sound signal from the processor 130 to the storage device 170. The microphone 110 receives not only the ambient noise but also the output sound signal. Thus, the processor 130 eliminates the echo of the input sound signal from the output sound signal in step 230 and then, evaluates a sound level of the input sound signal (i.e. the ambient noise) the in step 240.

In step 250, the processor 130 determines a gain value according to the sound level of the input sound signal. The gain value is an increasing function of the sound level of the input sound signal. In order to simplify the calculation process, the increasing function may be complied as a look-up table, such that the processor 130 may determine the gain value by using the look-up table.

In step 260, the processor 130 uses the gain value to amplify the output sound signal. In step 270, the digital-to-analog converter 140 converts the output sound signal from digital signal into analog signal. The, in step 280, the speaker 150 plays the output sound signal. Since the gain value of the output sound signal is proportional to the sound level of the ambient noise, the playback sound level of the speaker 150 may be consistent with the ambient noise, without being too high or too low.

Figure 3:
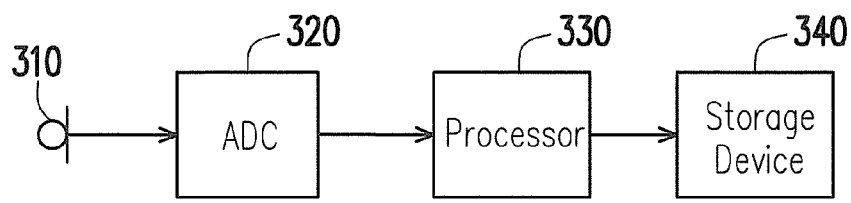
FIG. 3 is a schematic diagram illustrating a sound recording device according an embodiment of the invention.

FIG. 3 is a schematic diagram illustrating a sound recording device 300 according an embodiment of the invention. The sound recording device 300 may be any type of electronic device having a sound recording capability. The sound recording device 300 includes a microphone 310, an analog-to-digital converter 320, a processor 330 and a storage device 340. The analog-to-digital converter 320 is coupled to the microphone 310, and the processor 330 is coupled to the analog-to-digital converter 320 and the storage device 340. In the present embodiment, the storage device 340 is an element built in the sound recording device 300, while in another embodiment, the storage device 340 may not have to belong to the sound recording device 300, but externally connected with the sound recording device 300.

Figure 4:
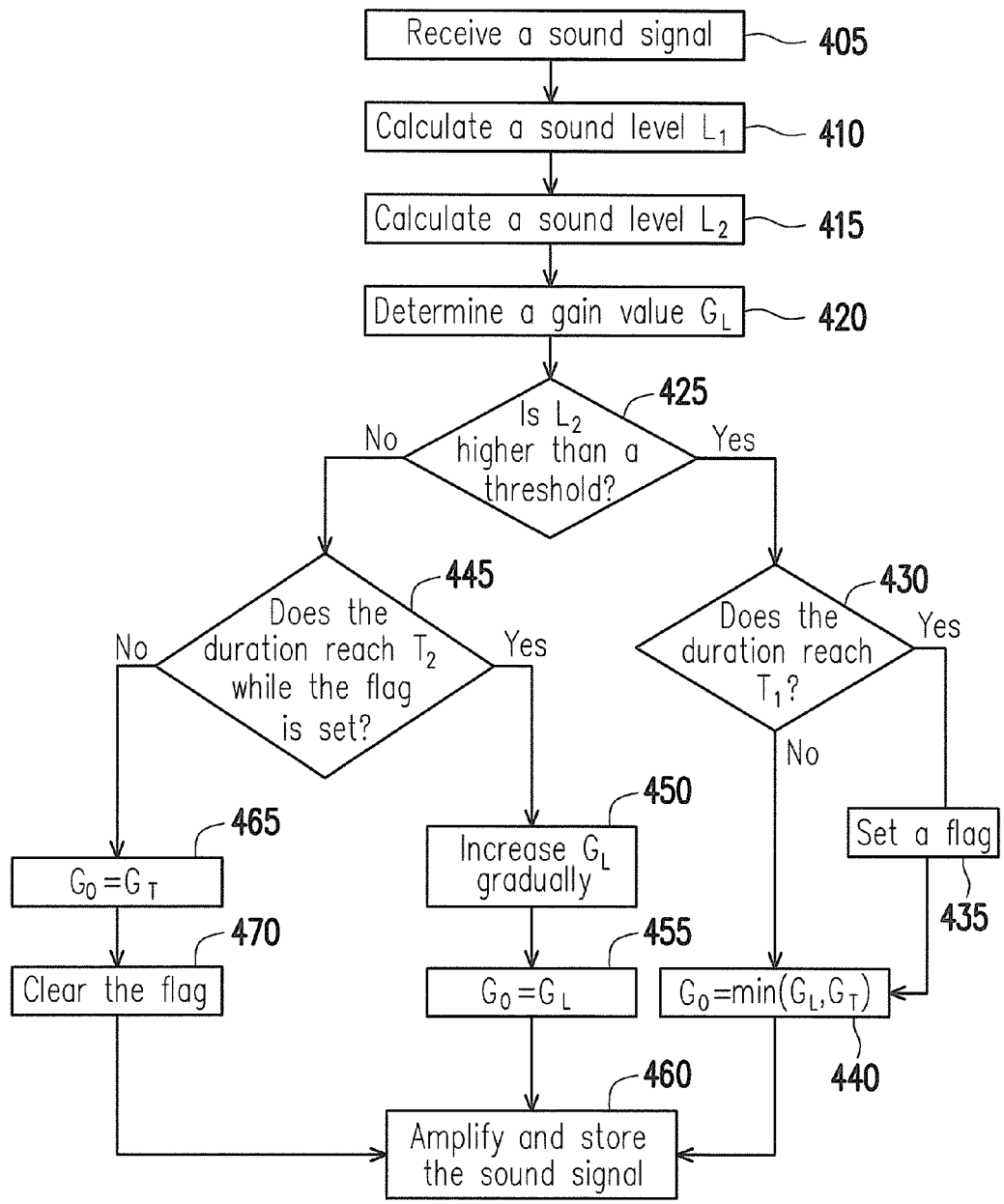
FIG. 4 is a flowchart illustrating a gain controlling method according an embodiment of the invention.

FIG. 4 is a flowchart illustrating a gain controlling method according an embodiment of the invention. Step 405 of the method may be performed by the microphone 310 and the analog-to-digital converter 320, while the other steps may be performed by the processor 330.

In step 405, the microphone 310 receives a sound signal. The analog-to-digital converter 320 converts the sound signal from analog signal into digital signal. In step 410, the processor 330 calculates a sound level $L_1$ of the sound signal. The processor 330 may analyze each of the sound signal in a past period $P_1$, calculate a maximum value (a maximum amplitude of the sound signal) of absolute values of the values or a root mean square value of absolute values of the values and serve the calculated value as the sound level $L_1$ of the sound signal.

Then, in step 415, the processor 330 calculates another sound level $L_2$ of the sound signal. The processor 330 may determine another past period $P_2$ according to the sound level $L_1$, where a time length of the $P_2$ is proportional to the sound level $L_1$. Thus, when the sound level $L_1$ is higher than a threshold, the time length of the past period $P_2$ is longer than a time length of the past period $P_1$. Thereafter, the processor 330 may analyze each of the sound signal in the past period $P_2$, calculate a maximum value or a root mean square value of absolute values of the values of the sound signal and serve the calculated value as a sound level $L_2$ of the sound signal. In step 420, the processor 330 determines a gain value $G_L$ according to the sound level $L_2$, where the gain value $G_L$ is inversely proportional to the sound level $L_2$. For example, the processor 330 may locate a corresponding gain value $G_L$ according to the sound level $L_2$ in a look-up table.

Then, in step 425, the processor 330 checks whether the sound level $L_2$ is higher than a predetermined threshold. If the sound level $L_2$ is higher than the threshold, the processor 330 checks a duration in which the sound level $L_2$ is higher than the threshold reaches a predetermined time length T in step 430. If yes, the processor 330 sets a flag in step 435 and then, sets a final gain value $G_O$ of the sound signal to be equal to the minimum value of the gain value $G_L$ and another gain value $G_T$ in step 440. The gain value $G_T$ is a predetermined constant. $G_T$ is a target gain value corresponding to the sound signal when the sound signal has a lower sound level, and $G_T$ is generally greater than $G_L$. If the result of step 430 is "No", the process directly enters step 440.

Then, in step 460, the processor 330 uses the final gain value $G_O$ to amplify the sound signal and then stores the sound signal in the storage device 340. If the amplitude of the gain value $G_O$ of the sound signal exceeds a predetermined upper limit after the sound signal is amplified, the processor 330 may decrease the gain value $G_O$ to prevent the amplitude of the sound signal from exceeding the predetermined upper limit.

If the result of step 425 is "No", in step 445, the processor 330 checks whether the flag of step 435 is set and the duration in which the sound level $L_2$ is lower than or equal to a predetermined threshold reaches another predetermined time length $T_2$. By means of combining steps 430, 435 and 445, it can be learned that the checking condition of step 445 is whether the duration in which the sound level $L_2$ is higher than the threshold reaches the time length $T_1$ and then the duration in which the sound level $L_2$ is lower than or equal to the threshold reaches the time length $T_2$. If the condition is satisfied, in step 450, the processor 330 gradually increases the gain value $G_L$ up to be equal to the gain value $G_T$ within the next predetermined period and sets the final gain value $G_O$ to be equal to the gain value $G_L$ in step 455, and then the process enters step 460. During the predetermined period, in step 460, the final gain value $G_O$ used by the processor 330 is gradually increased from $G_L$ at the beginning to be equal to $G_T$.

If the result of step 425 is "No", and the checking condition of step 445 is not satisfied, in step 465, the processor 330 sets the final gain value $G_O$ to be equal to the gain value $G_T$ and in step 470, clears the flag of step 435, and then, the process enters step 460. By doing so, it can be ensured that the sound signal with the lower sound level will have the greater gain.

Figure 5:
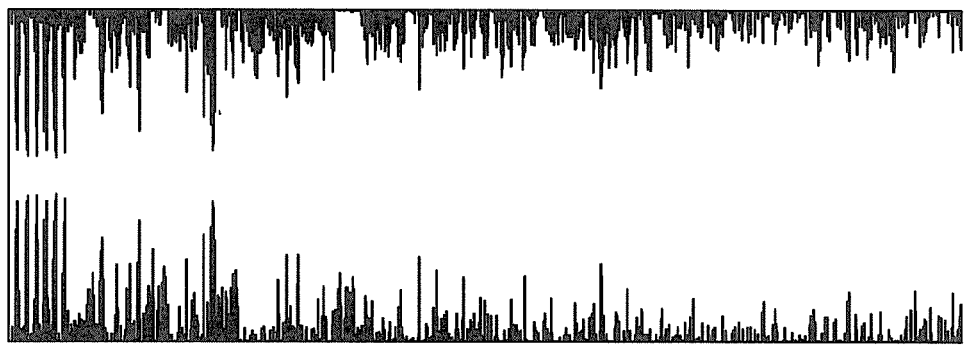
FIG. 5 is a schematic diagram of a conventional sound signal.

FIG. 5 is a schematic diagram illustrating a waveform of the sound signal being amplified during sound recording according to the conventional technique. In FIG. 5, the longitudinal axis represent values of the sound signal, the horizontal axis represents time, the black part is the background, and the white part is the waveform of the sound signal. With reference to FIG. 5, most of the signals are amplified to reach the same target sound level, but the real original sound levels are not such consistent, which leads to the reduction of the dynamic range of the sound signal.

Figure 6:
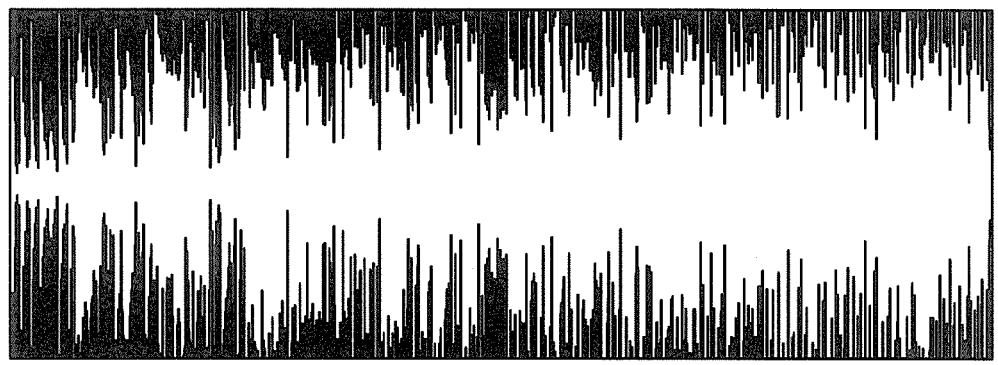
FIG. 6 is a schematic diagram of a sound signal according to an embodiment of the invention.

FIG. 6 is a schematic diagram illustrating a waveform of the sound signal being amplified during sound recording according to an embodiment of the invention. In FIG. 6, the longitudinal axis represent values of the sound signal, the horizontal axis represents time, the black part is the background, and the white part is the waveform of the sound signal. With reference to FIG. 4 and FIG. 6, the final gain value $G_O$ of the sound signal is determined according to the value and the change of the sound level of the sound signal, and thereby, the dynamic range of the sound signal may be kept, and the recorded sound signal is more closed to the original signal before being recorded.

According to another embodiment of the invention, an electronic device is provided. The electronic device combines the sound playback device 100 illustrated in FIG. 1 and the sound recording device 300 illustrated in FIG. 3. The electronic device may record and store a sound signal like the way the sound recording device 300 does, and plays the sound signal like the way the sound playback device 100 does. In the electronic device, the microphone 110 illustrated in FIG. 1 and the microphone 310 illustrated in FIG. 3 may be integrated together as one, the analog-to-digital converter 120 illustrated in FIG. 1 and the analog-to-digital converter 320 illustrated in FIG. 3 may be integrated together as one, and the processor 130 illustrated in FIG. 1 and the processor 330 illustrated in FIG. 3 may also be integrated together as one.

According to yet another embodiment of the invention, a gain controlling method is provided. The gain controlling method combines the gain controlling methods illustrated in FIG. 2 and FIG. 4. In the gain controlling method, a sound signal may be first recorded and stored as the way the gain controlling method illustrated FIG. 4 is performed, and then, the sound signal is played as the way the gain controlling method illustrated in FIG. 2 is.

To conclude, in the invention, the gain of the sound signal can be dynamically adjusted according to the sound level of the environment, such that played sound level can work well with the ambient sound level, without being too high or too low. Moreover, in the invention, the gain of the sound signal can be dynamically adjusted according the value and the change of the sound level of the sound signal in the past period, such that the dynamic range and fidelity of the sound signal can be kept.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An electronic device, comprising:
a microphone, receiving a first sound signal;
an analog-to-digital converter, coupled to the microphone and converting the first sound signal from analog signal into digital signal; and
a first processor, coupled to the analog-to-digital converter, calculating a first sound level according to each value of the first sound signal in a first past period, determining a first gain value positively proportional to the first sound level of an ambient noise, using the first gain value to amplify the first sound signal and then storing the first sound signal.

2. The electronic device according to claim 1, wherein the first processor determines a second past period according to the first sound level, calculates a second sound level according to each value of the first sound signal in the second past period, determines a second gain value according to the second sound level, and determines the first gain value according to at least one of the second gain value and a third gain value, wherein the third gain value is a predetermined constant.

3. The electronic device according to claim 2, wherein a time length of the second past period is proportional to the first sound level.

4. The electronic device according to claim 3, wherein when the first sound level is higher than a threshold, the time length of the second past period is longer than a time length of the first past period.

5. The electronic device according to claim 2, wherein the second gain value is inversely proportional to the second sound level.

6. The electronic device according to claim 2, wherein if the second sound level is higher than a threshold, the first gain value is equal to the minimum value of the second gain value and the third gain value.

7. The electronic device according to claim 2, wherein if the second sound level meets a predetermined condition, the first processor gradually increases the second gain value up to be equal to the third gain value within a predetermined period, and the first gain value is equal to the second gain value within the predetermined period, wherein the predetermined condition is a duration in which the second sound level is greater than a threshold reaching a first time length and then a duration in which the second sound level is lower than or equal to the threshold reaching a second time length.

8. The electronic device according to claim 7, wherein if the second sound level is lower than or equal to the threshold, and the second sound level does not meet the predetermined condition, the first gain value is equal to the third gain value.

9. The electronic device according to claim 1, wherein if an amplitude of the first sound signal which is amplified by using the first gain value exceeds a predetermined upper limit, the first processor decreases the first gain value to prevent the amplitude from exceeding the predetermined upper limit.

10. The electronic device according to claim 1, wherein after the first processor stores the first sound signal, the microphone further receives a second sound signal, the analog-to-digital converter converts the second sound signal from analog signal into digital signal, the first processor evaluates a third sound level of the second sound signal, determines a fourth gain value according to the third sound level and uses the fourth gain value to amplify the first sound signal, and the electronic device further comprises:
a digital-to-analog converter, coupled to the first processor and converting the first sound signal from digital signal into analog signal; and
a speaker, coupled to the digital-to-analog converter and playing the first sound signal.

11. The electronic device according to claim 10, wherein the first processor first eliminates echo of the first sound signal from the second sound signal and then evaluates the third sound level.

12. The electronic device according to claim 10, wherein the fourth gain value is an increasing function of the third sound level.

13. The electronic device according to claim 10, wherein the first processor stores the first sound signal in a storage device, and the electronic device further comprises:
a second processor, coupled to the first processor, providing the first sound signal from the storage device to the first processor.

14. A gain controlling method, comprising:
receiving a first sound signal;
calculating a first sound level according to each value of the first sound signal in a first past period;
determining a first gain value positively proportional to the first sound level of an ambient noise; and
using the first gain value to amplify the first sound signal and then storing the first sound signal.

15. The gain controlling method according to claim 14, wherein the step of determining the first gain value according to the first sound level comprising:
determining a second past period according to the first sound level;
calculating a second sound level according to each value of the first sound signal in the second past period;
determining a second gain value according to the second sound level; and determining the first gain value according to at least one of the second gain value and a third gain value, wherein the third gain value is a predetermined constant.

16. The gain controlling method according to claim 15, wherein a time length of the second past period is proportional to the first sound level.

17. The gain controlling method according to claim 16, wherein when the first sound level is higher than a threshold, the time length of the second past period is longer than a time length of the first past period.

18. The gain controlling method according to claim 15, wherein the second gain value is inversely proportional to the second sound level.

19. The gain controlling method according to claim 15, wherein if the second sound level is higher than a threshold, the first gain value is equal to the minimum value of the second gain value and third gain value.

20. The gain controlling method according to claim 15, wherein if the second sound level meets a predetermined condition, the method further comprises:

gradually increasing the second gain value up to be equal to the third gain value within a predetermined period, and the first gain value being equal to the second gain value within the predetermined period, wherein the predetermined condition is a duration in which the second sound level is higher than a threshold reaching a first time length and then a duration in which the second sound level is lower than or equal to the threshold reaching a second time length.

21. The gain controlling method according to claim 20, wherein if the second sound level is lower than or equal to the threshold, and the second sound level does not meet the predetermined condition, the first gain value is equal to the third gain value.

22. The gain controlling method according to claim 14, further comprising:

if an amplitude of the first sound signal which is amplified by using the first gain value exceeds a predetermined upper limit, decreasing the first gain value to prevent the amplitude from exceeding the predetermined upper limit.

23. The gain controlling method according to claim 14, after the step of storing the first sound signal, the method further comprising:

receiving a second sound signal;

evaluating a third sound level of the second sound signal;

determining a fourth gain value according to the third sound level;

using the fourth gain value to amplify the first sound signal; and playing the first sound signal.

24. The gain controlling method according to claim 23, further comprising:

eliminating echo of the first sound signal from the second sound signal and then evaluating the third sound level.

25. The gain controlling method according to claim 23, wherein the fourth gain value is an increasing function of the third sound level.

* * * * *